(12) United States Patent
Mimura et al.

(10) Patent No.: US 7,898,145 B2
(45) Date of Patent: Mar. 1, 2011

(54) BOUNDARY ACOUSTIC WAVE DEVICE

(75) Inventors: Masakazu Mimura, Kusatsu (JP);
Yasuhisa Fujii, Kanazawa (JP); Masaru Yata, Kanazawa (JP); Norihiko Nakahashi, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/409,702

(22) Filed: Mar. 24, 2009

(65) Prior Publication Data

US 2009/0174284 A1 Jul. 9, 2009

Related U.S. Application Data

(63) Continuation of application No. PCT/JP2007/067032, filed on Aug. 31, 2007.

(30) Foreign Application Priority Data

Sep. 25, 2006 (JP) ................................ 2006-259023

(51) Int. Cl.
*H03H 9/25* (2006.01)
(52) U.S. Cl. ..................................... 310/313 A; 310/364
(58) Field of Classification Search .............. 310/313 A, 310/313 R, 364; 333/186–188, 193–196
See application file for complete search history.

(56) References Cited

U.S. PATENT DOCUMENTS

| | | | |
|---|---|---|---|
| 4,484,098 A * | 11/1984 | Cullen et al. ............. | 310/313 A |
| 2005/0057323 A1 | 3/2005 | Kando | |
| 2005/0099091 A1 | 5/2005 | Mishima et al. | |
| 2006/0071579 A1 | 4/2006 | Kando | |
| 2007/0222337 A1* | 9/2007 | Kadota et al. ................ | 310/320 |

FOREIGN PATENT DOCUMENTS

| | | |
|---|---|---|
| EP | 1 696 562 A1 | 8/2006 |
| JP | 2001-077658 A | 3/2001 |
| JP | 2004-159262 A | 6/2004 |
| WO | 98/52279 A1 | 11/1998 |
| WO | 2005/036743 A1 | 4/2005 |
| WO | 2005/036744 A1 | 4/2005 |
| WO | 2005/060094 A1 | 6/2005 |

OTHER PUBLICATIONS

Official Communication issued in International Patent Application No. PCT/JP2007/067032, mailed on Nov. 6, 2007.

* cited by examiner

*Primary Examiner* — Thomas M Dougherty
(74) *Attorney, Agent, or Firm* — Keating & Bennett, LLP (57) ABSTRACT

A boundary acoustic wave device includes a piezoelectric substance made of LiNbO$_3$ having a surface obtained by rotating a Y axis by about 15°±10° as a primary surface, a dielectric substance which is made of a silicon oxide and which is laminated to the piezoelectric substance, and an electrode structure disposed at a boundary between the piezoelectric substance and the dielectric substance and which includes an IDT arranged to utilize a boundary acoustic wave propagating along the boundary. When the density of the IDT, the thickness thereof, the wavelength deter-mined by the period of electrode fingers of the IDT, and the duty ratio thereof are represented by ρ (kg/m$^3$), H (μm), λ (μm), and x, respectively, x and the product of H/λ and ρ are set in a range that satisfies the following formula (1):

$$(H/\lambda) \times \rho > 70.7924(x+0.055)^{(-2.884)} + 797.09 \quad \text{Formula (1)}.$$

11 Claims, 6 Drawing Sheets

BOUNDARY ACOUSTIC WAVE DEVICE

BACKGROUND OF THE INVENTION

1. Field of the Invention

The present invention relates to a boundary acoustic wave device using a boundary acoustic wave which propagates along a boundary between a first medium and a second medium that have different acoustic velocities, and more particularly, to a boundary acoustic wave device that includes a piezoelectric substance made of LiNbO$_3$ and a dielectric substance made of a silicon oxide laminated to the piezoelectric substance.

2. Description of the Related Art

Recently, as a band pass filter used in the RF stage of a mobile phone, various surface acoustic wave filters and boundary acoustic wave filters have been proposed. In a boundary acoustic wave filter, a boundary acoustic wave propagating along a boundary between a piezoelectric substance and a dielectric substance is used. Accordingly, since a package having a cavity is not required, the size of the boundary acoustic wave filter can be reduced.

WO2004/070946 discloses one example of this type of boundary acoustic wave device. In the boundary acoustic wave device disclosed in WO2004/070946, electrodes including an IDT are provided at a boundary between a piezoelectric substance and a dielectric substance, and an SH type boundary acoustic wave propagating along the boundary is used.

In the boundary acoustic wave device described above, the thickness of the IDT is set such that the acoustic velocity of the SH type boundary acoustic wave is less than the acoustic velocity of a slow transverse wave propagating through the dielectric substance and the acoustic velocity of a slow transverse wave propagating through the piezoelectric substance. In addition, when LiNbO$_3$ is used as the piezoelectric substance, and when SiO$_2$ is used as the dielectric substance, an electrode thickness range in which the propagation loss is decreased to approximately 0 and a cut angle range of LiNbO$_3$ in which an unnecessary spurious response is decreased are shown.

In a boundary acoustic wave device, depending on the application, a small change in frequency characteristics due to a temperature change, that is, a reduced absolute value of TCF, may be required. In the boundary acoustic wave device disclosed in WO2004/070946, LiNbO$_3$ is used as the piezoelectric substance and SiO$_2$ is used as the dielectric substance. The temperature coefficient of frequency TCF of LiNbO$_3$ is a negative value, and the temperature coefficient of frequency TCF of SiO$_2$ is a positive value. Accordingly, when LiNbO$_3$ and SiO$_2$ are used, the absolute value of the temperature coefficient of frequency TCF can be reduced.

In addition, an electrode thickness at which the propagation loss of an SH boundary acoustic wave is decreased to approximately 0 varies according to the duty ratio of the IDT. For example, when the duty ratio is decreased, in the thickness range of the IDT disclosed in WO2004/070946, the propagation loss is not decreased to approximately 0 and is relatively large in some cases. Thus, even if TCF can be decreased, the loss inevitably increases.

On the other hand, when the duty ratio of the IDT is increased, it is possible to decrease the propagation loss to approximately 0. However, when the duty ratio is increased, the absolute value of TCF increases, and as a result, frequency temperature characteristics are deteriorated. In addition, when the duty ratio is relatively high, the variation in frequency caused by fluctuation in linewidth decreases, and consequently, the yield is advantageously improved.

SUMMARY OF THE INVENTION

To overcome the problems described above, preferred embodiments of the present invention provide a boundary acoustic wave device which has a low temperature coefficient of frequency TCF and a low insertion loss when the duty ratio is low, and which has a low loss and a yield of which is not likely to decrease when the duty ratio is high.

According to a preferred embodiment of the present invention, a boundary acoustic wave filter which includes a piezoelectric substance made of LiNbO$_3$ having a surface obtained by rotating a Y axis by about 15°±10° as a primary surface, a dielectric substance which is made of a silicon oxide and which is laminated to the piezoelectric substance, and an electrode structure which is disposed at a boundary between the piezoelectric substance and the dielectric substance and which includes an IDT to utilize a boundary acoustic wave propagating along the boundary. A boundary acoustic wave device is provided in which when the density of the IDT, the thickness thereof, the wavelength determined by the period of electrode fingers of the IDT, and the duty ratio thereof are represented by ρ(kg/m$^3$), H (μm), λ(μm), and x, respectively, x and the product of H/λ and ρ are set in the range that satisfies the following formula (1).

$$(H/\lambda) \times p > 70.7924(x+0.055)^{(-2.0884)} + 797.09 \quad \text{Formula (1)}$$

Although the upper limit of the thickness of the IDT is not particularly limited, due to the restriction from a manufacturing point of view, the thickness is preferably set to about 0.35λ or less.

The silicon oxide of the dielectric substance is preferably SiO$_2$, and the acoustic velocity of the boundary acoustic wave is preferably set to about 93% or less of about 3,757 m/sec which is the acoustic velocity of a transverse wave of SiO$_2$. In this case, the insertion loss can be further decreased.

In addition, in preferred embodiments of the present invention, the IDT may be made of various metals and alloys. However, in accordance with a preferred embodiment of the present invention, the IDT is preferably made of Au or an alloy primarily including Au, for example, and when the thickness of Au or an alloy primarily including Au is represented by H$_{Au}$, the thickness H$_{Au}$ is preferably set in the range that satisfies the following formula (2). In this case, since the thickness H$_{Au}$ satisfies the formula (2), when a low duty ratio is selected, the absolute value of TCF and the insertion loss can be decreased, and when a high duty ratio is selected, the yield is good, and a decrease in loss can be achieved.

$$H_{Au}/\lambda > 0.003668(x+0.055)^{(-2.0884)} + 0.0413 \quad \text{Formula (2)}$$

In this specification, a low duty ratio is defined as a duty ratio of less than about 0.5, and a high duty ratio is defined as a duty ratio of greater than about 0.5. That is, the duty of the IDT is typically set to about 0.5, and by using a duty ratio of about 0.5 as a reference, a duty ratio of less than about 0.5 is defined as a low duty ratio, and a duty ratio of greater than about 0.5 is defined as a high duty ratio.

In accordance with a preferred embodiment of the present invention, the IDT is made of Cu or an alloy primarily including Cu, and when the thickness of Cu or an alloy primarily including Cu is represented by H$_{Cu}$, the thickness H$_{Cu}$ is set in the range that satisfies the following formula (3).

$$H_{Cu}/\lambda > 0.007927(x+0.055)^{(-2.0884)} + 0.08926 \quad \text{Formula (3)}$$

In this case, since the thickness $H_{Cu}$ is set in the range shown by the formula (3), when a low duty ratio is selected, the absolute value of TCF and the insertion loss can be decreased, and when a high duty ratio is selected, an improvement in yield and a decrease in insertion loss can be achieved.

H indicates the thickness (μm) of the IDT, and λ indicates the wavelength (μm) determined by the period of electrode fingers of the IDT. Thus, H/λ is a normalized thickness of the IDT, and $H_{Au}/\lambda$ or $H_{Cu}/\lambda$ represents the normalized thicknesses of the IDT when Au or Cu is respectively used therefor.

Preferably, the IDT is made of a laminate metal film including a plurality of metal layers that are laminated to each other, and when the average density obtained in accordance with the thickness ratio among the laminated metal layers is represented by the above ρ (kg/m³), and the total thickness of the laminate metal film is represented by the above H, the product of H and ρ satisfies the above formula (1). As described above, the IDT may be made of a laminate metal film, and when the materials for the metal layers of the laminate metal film are variously selected, the adhesion between the piezoelectric substance and the dielectric substance may be increased, or the electric power resistance may be improved.

It is preferable that the IDT include a Au-based metal layer made of Au or an alloy primarily including Au and be made of a laminate metal film including a frequency-adjusting film/Ti/Pt/the Au-based metal layer/Pt/Ti. The diffusion between Au and Ti is suppressed, and the adhesion to the piezoelectric substance and the dielectric substance is improved by the Ti films. Thus, the reliability of the boundary acoustic wave filter can be improved. The thickness of Pt is preferably set in the range of about 3 nm to about 10 nm, for example. In this case, the diffusion of Au from the Au-based metal layer can be reliably suppressed, and the electrode finger resistance is decreased, so that the insertion loss can be further decreased.

According to a preferred embodiment of the present invention, the duty ratio of the IDT is preferably set in the range of about 0.3 to about 0.7 and is more preferably set in the range of about 0.3 to about 0.4. When the duty ratio of the IDT is set in the range of about 0.3 to about 0.7, the IDT is easily formed, and when the duty ratio is set in the range of about 0.3 to about 0.4, the IDT is easily formed, and TCF and the loss can also be decreased.

In the boundary acoustic wave device according to preferred embodiments of the present invention, since the electrode structure including the IDT is disposed at the boundary between the piezoelectric substance made of LiNbO₃ having a surface obtained by rotating a Y axis by about 15°±10° as a primary surface and the dielectric substance which is made of a silicon oxide, and since the product of the normalized thickness H/λ and the density ρ of the IDT and the duty ratio x thereof are set in the range that satisfies the above formula (1), the loss can be decreased.

As the duty ratio of the IDT is decreased, the absolute value of TCF decreases, and the frequency temperature characteristics can be improved.

On the other hand, as the duty ratio of the IDT is increased, since the linewidth dependency of frequency decreases, the variation in frequency caused by fluctuations in linewidth decreases. Accordingly, the yield is improved.

Thus, the optimum value of the duty ratio may be selected in accordance with the desired application. However, the thickness of the IDT at which the propagation loss sufficiently decreases varies depending on the duty ratio. Since the thickness of the IDT is also determined based on the duty ratio, when the above formula (1) is satisfied, the temperature coefficient of frequency TCF and the insertion loss can both be decreased when the duty ratio is relatively low, such that an improvement in frequency temperature characteristics and a decrease in loss can be achieved. In addition, when a relatively high duty ratio is selected, a boundary acoustic wave device is provided which has a low loss, and the yield of which is improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the drawings.

Figure 1A:
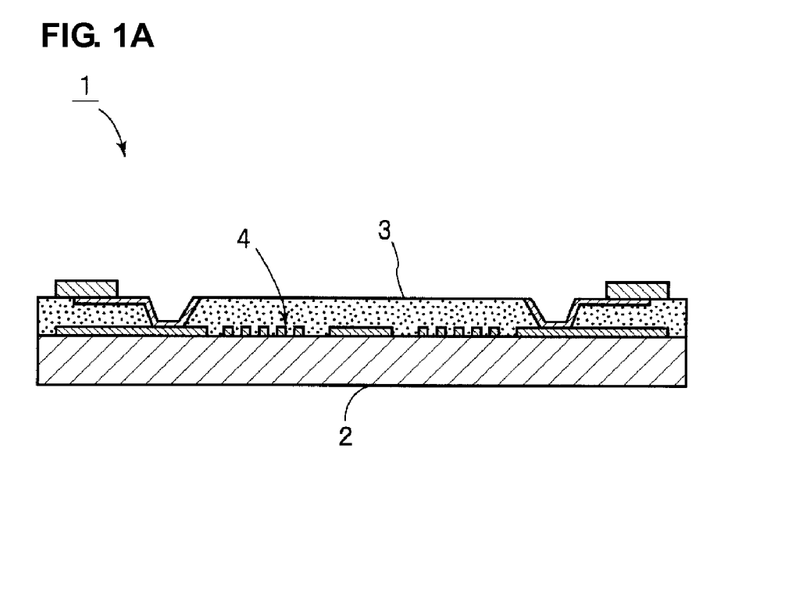
FIGS. 1A and 1B are a schematic front cross-sectional view of a boundary acoustic wave filter according to a preferred embodiment of the present invention and a schematic plan view showing an electrode structure, respectively.
Figure 1B:
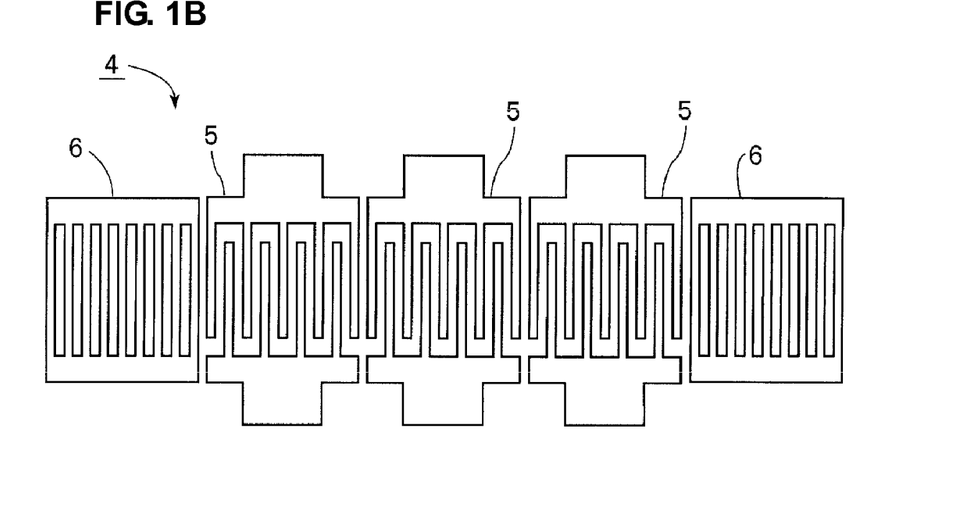

FIG. 1A is a front cross-sectional view schematically showing a boundary acoustic wave filter according to a preferred embodiment of the present invention, and FIG. 1B is a schematic plan view showing an electrode structure including an IDT.

A boundary acoustic wave filter 1 includes a piezoelectric substance 2 and a dielectric substance 3. The piezoelectric substance 2 is preferably made of LiNbO₃ having a surface obtained by rotating a Y axis by about 15°±10° as a primary surface. In addition, the dielectric substance 3 is preferably made of a silicon oxide, and in this preferred embodiment, SiO$_2$ is preferably used as the silicon oxide. However, the dielectric substance 3 may be made of a silicon oxide other than SiO$_2$. At a boundary between the piezoelectric substance 2 and the dielectric substance 3, an electrode structure 4 shown in FIG. 1B is provided. That is, a plurality of IDTs 5 and reflectors 6 which are disposed at two sides in a propagation direction of a boundary acoustic wave are provided. Accordingly, a longitudinally coupled resonator-type boundary acoustic wave filter is provided.

In the boundary acoustic wave filter of this preferred embodiment, the electrode structure 4 including the IDTs 5 is made using a metal having a high density at the boundary between the piezoelectric substance 2 made of LiNbO$_3$ and the dielectric substance 3 made of SiO$_2$. Accordingly, when the acoustic velocity of an SH type boundary acoustic wave propagating along a boundary portion is set equal or substantially equal to or less than the acoustic velocity of a transverse wave of the piezoelectric substance 2 and the acoustic velocity of a transverse wave of the dielectric substance 3, the SH type boundary acoustic wave is confined at the boundary.

Figure 2:
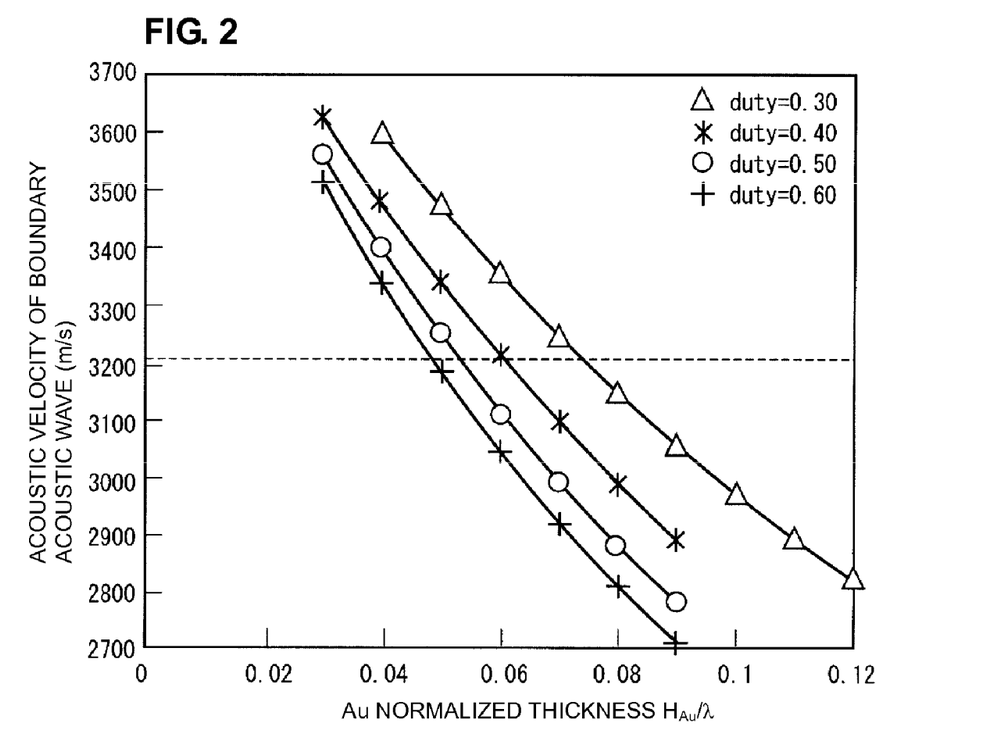
FIG. 2 is a view showing the relationship between the acoustic velocity of a boundary acoustic wave and the thickness of an Au film, which is obtained when the duty ratio is set to 0.30, 0.40, 0.50, and 0.60.

When the thickness of the IDT 5 is relatively small, the acoustic velocity of the boundary acoustic wave is not sufficiently decreased, and the boundary acoustic wave is not easily confined. As a result, the loss is increased. Thus, in order to confine the boundary acoustic wave, the thickness of the IDT 5 must be set to at least a predetermined value, that is, the lower limit of the thickness of the IDT 5. Hereinafter, this lower limit of the thickness is called a cut-off thickness. The cut-off thickness can be determined by the acoustic velocity of the boundary acoustic wave. FIG. 2 is a view showing the relationship between a normalized thickness H$_{Au}$/λ of an IDT made of Au and the acoustic velocity of an SH type boundary acoustic wave in a boundary acoustic wave filter having a SiO$_2$/Au/LiNbO$_3$ structure. In this preferred embodiment, a laminate structure represented by SiO$_2$/Au/LiNbO$_3$ indicates a structure in which the IDT made of Au is provided at the boundary between SiO$_2$ and LiNbO$_3$.

Figure 3:
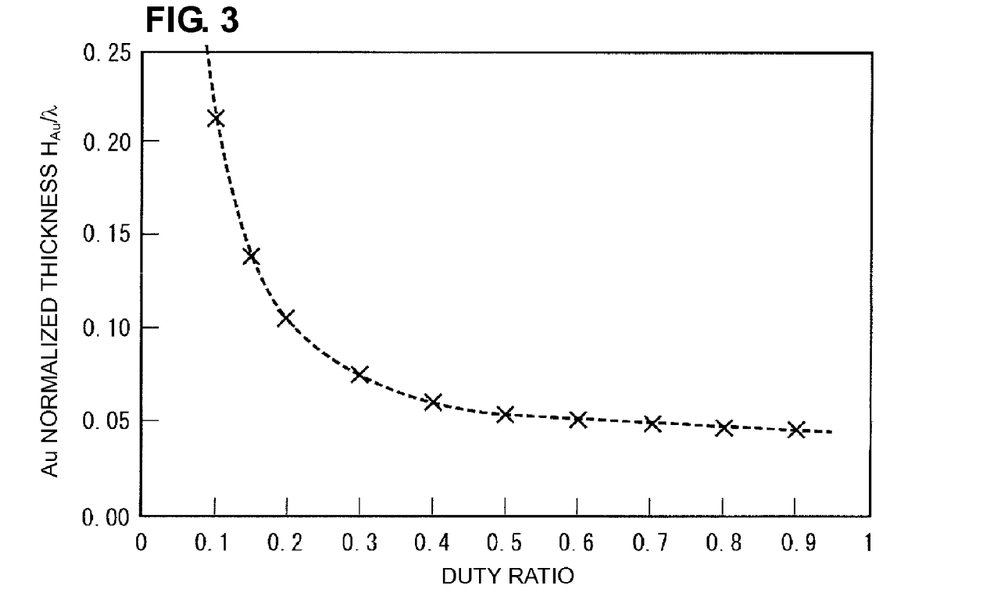
FIG. 3 is a view showing the relationship between the duty ratio of an IDT and a normalized thickness $H_{Au}/\lambda$ of the IDT at which a boundary acoustic wave is confined.

The acoustic velocity of the SH type boundary acoustic wave shown in FIG. 2 is an acoustic velocity at a lower end of a stopband obtained by the finite element method. This acoustic velocity corresponds to that at a low-frequency side end of a passband of the boundary acoustic wave filter 1. As shown in FIG. 2, it is determined that in each case in which the duty ratio of the IDT is about 0.30, about 0.40, about 0.50, or about 0.60, as the thickness of Au is decreased, the acoustic velocity increases and the boundary acoustic wave is not easily confined. In addition, as shown in FIG. 2, at each duty ratio, a thickness value of Au at which the acoustic velocity of the boundary acoustic wave is about 3,210 m/sec can be obtained. In the same manner as described above, when the duty ratio is about 0.1 to about 0.9, a thickness of Au at which the acoustic velocity of the boundary acoustic wave is about 3,210 m/sec was obtained. The results are shown in FIG. 3. FIG. 3 shows the normalized thickness H$_{Au}$/λ of an IDT made of Au at which the acoustic velocity of the boundary acoustic wave is about 3,210 m/sec in a duty ratio range of about 0.1 to about 0.9. As shown in FIG. 2, at each duty ratio, when the thickness of the IDT made of Au is greater than a thickness at which the acoustic velocity is about 3,210 m/sec, the acoustic velocity of the boundary acoustic wave is less than about 3,210 m/sec, and the boundary acoustic wave can be confined at the boundary portion. Thus, when the thickness is set equal or substantially equal to or more than the thickness shown by the dotted line in FIG. 3, the boundary acoustic wave can be confined at the boundary.

Figure 4:
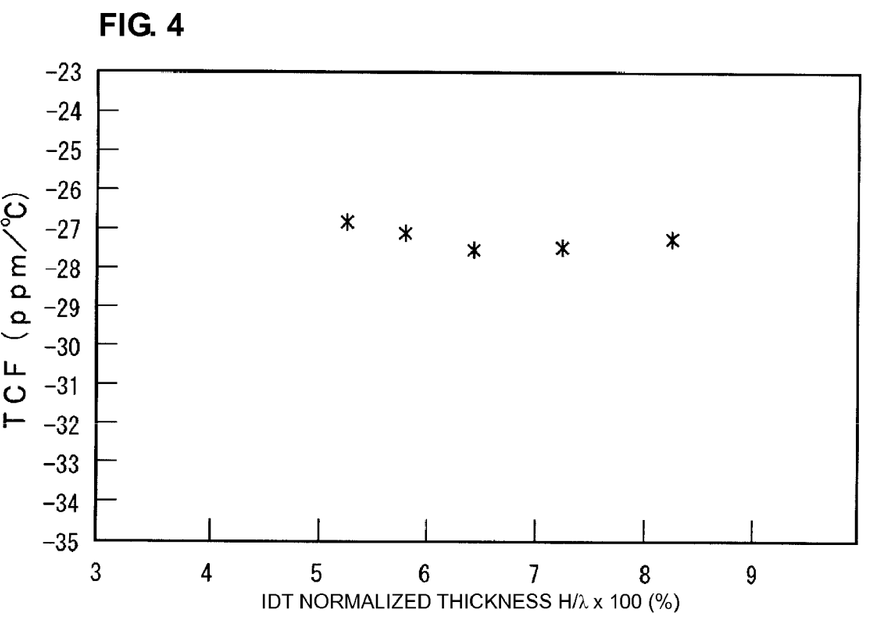
FIG. 4 is a view showing the relationship between the temperature coefficient of frequency TCF and a normalized thickness H/λ of an IDT composed of a NiCr/Ti/Pt/Au/Pt/Ti laminate metal film in which the thickness of the Au layer is variously changed.

In addition, FIG. 4 is a view showing the relationship between the temperature coefficient of frequency TCF (ppm/° C.) and a normalized thickness H/λ of an IDT of the boundary acoustic wave filter 1 obtained when the thickness of the IDT is variously changed which is made of a NiCr/Ti/Pt/Au/Pt/Ti laminate metal film in which the thickness of the Au layer is variously changed. The film thicknesses of the layers of NiCr, Ti, Pt, Pt, and Ti other than the Au layer are each fixed to about 10 nm.

As shown in FIG. 4, in the region in which the thickness of the IDT is relatively small, that is, in the region in which H/λ×100(%) is about 6.5% or less, as the thickness of the Au layer is increased, TCF increases and is deteriorated. Although TCF is further deteriorated when the thickness of the Au layer is about 7.0%, when the thickness of the Au layer is further increased, TCF decreases and is improved.

Figure 5:
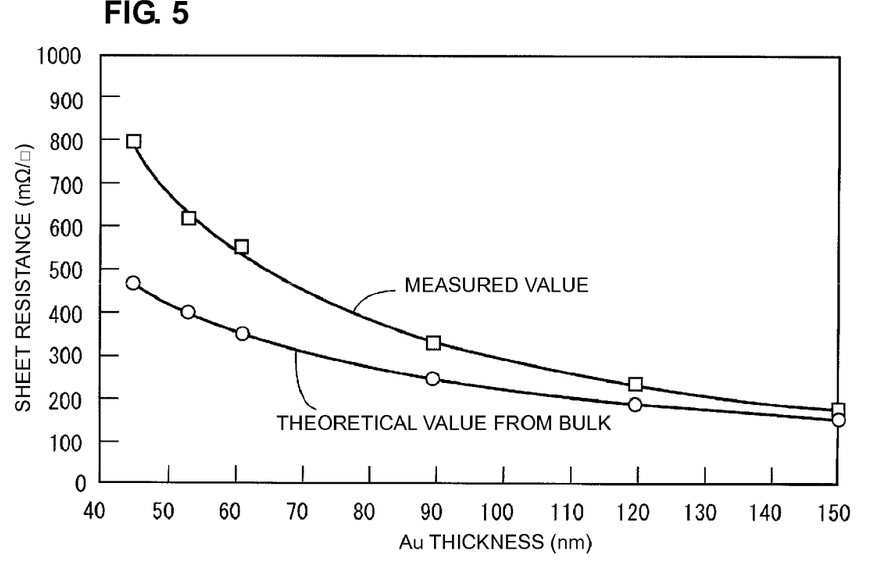
FIG. 5 is a view showing the relationship between the thickness of Au defining an IDT and a sheet resistance thereof.

In addition, FIG. 5 is a view showing the change in sheet resistance when the IDT is made only of Au, and when the thickness (nm) thereof is changed. As shown in FIG. 5, as the thickness of the IDT is increased, the sheet resistance of the electrode decreases and the resistance of each electrode finger of the IDT decreases. Thus, the insertion loss can be decreased. Accordingly, as the thickness of the IDT is increased, the insertion loss and TCF are improved. Thus, in order to obtain improved characteristics, the upper limit of the thickness of the IDT is not particularly limited.

However, due to the restrictions from a process point of view, in actuality there is an upper limit. For example, when a SiO$_2$ film is formed by sputtering after the IDT is formed on LiNbO$_3$, as the thickness of the IDT is increased, voids may be generated in SiO$_2$ or the coverage thereof may be deteriorated in some cases. Thus, the thickness of the IDT is preferably set to about 0.35λ or less due to the restrictions from a process point of view.

As described above, the lower limit of the thickness of the IDT is determined by the cut-off thickness described above, and that in order to improve the characteristics, the upper limit is not particularly limited. In addition, the cut-off thickness depends on the duty ratio. When the duty ratio is decreased, the cut-off thickness is increased due to a mass load being decreased.

The thickness of the IDT at which cut-off occurs is substantially determined by the density of an electrode material, and the density and the cut-off thickness have an inverse relationship. Thus, the product of the density of the IDT and the thickness thereof must be set to at least a predetermined value.

The change in cut-off thickness with the change in duty ratio obtained when the IDT made of Au is used as the IDT is shown in FIG. 3 as described above. Thus, a value obtained when the cut-off thickness obtained in FIG. 3 is multiplied by a Au density of about 19,300 (kg/m$^3$) is a value obtained when a cut-off thickness of an IDT made of a metal is multiplied by a density ρ of the IDT. This value corresponds to the following formula (1A).

$(H/λ)×ρ=70.7924(x+0.055)^{(-2.0884)}+797.09$      Formula (1A)

Figure 6:
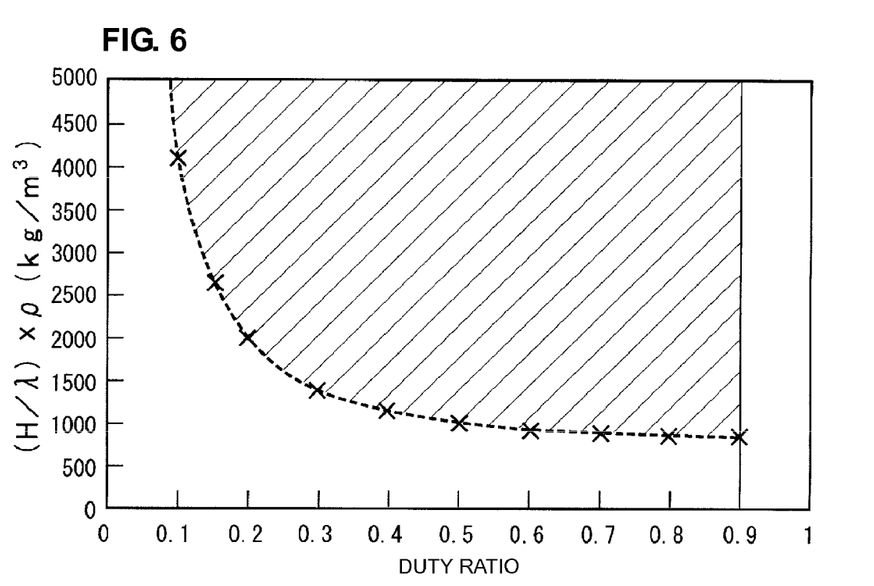
FIG. 6 is a view showing the relationship between the duty ratio and the product of a density ρ and a normalized thickness H/λ when a boundary acoustic wave is confined.

Accordingly, the range in which the thickness is greater than that represented by the formula (1A), that is, the range hatched with oblique lines shown in FIG. 6, is the range in which TCF and the loss can be decreased.

Thus, in this preferred embodiment, the product of the thickness H/λ of the IDT and the density thereof is set in the range that satisfies the following formula (1).

$(H/λ)×ρ>70.7924(x+0.055)^{(-2.0884)}+797.09$      Formula (1)

In Formula (1), although the density of the IDT is represented by ρ, when the IDT is made of Au, since the density ρ is about 19,300 (kg/m³), instead of the formula (1), the thickness $H_{Au}/\lambda$ is in the range that satisfies the following formula (2).

$$H_{Au}/\lambda > 0.003668(x+0.055)^{(-2.0884)} + 0.0413 \quad \text{Formula (2).}$$

That is, the thickness $H_{Au}/\lambda$ may be set in the range in which the thickness is equal or substantially equal to or greater than that on the dotted line shown in FIG. 3.

In addition, when Cu is used for the IDT, since the density of Cu is about 8,930 (kg/m³), the above formula (1) may be divided by the density of Cu. Thus, the thickness $H_{Cu}/\lambda$ may be set in the range that satisfies the following formula (3)

$$H_{Cu}/\lambda > 0.007927(x+0.055)^{(-2.0884)} + 0.08926 \quad \text{Formula (3)}$$

Figure 7:
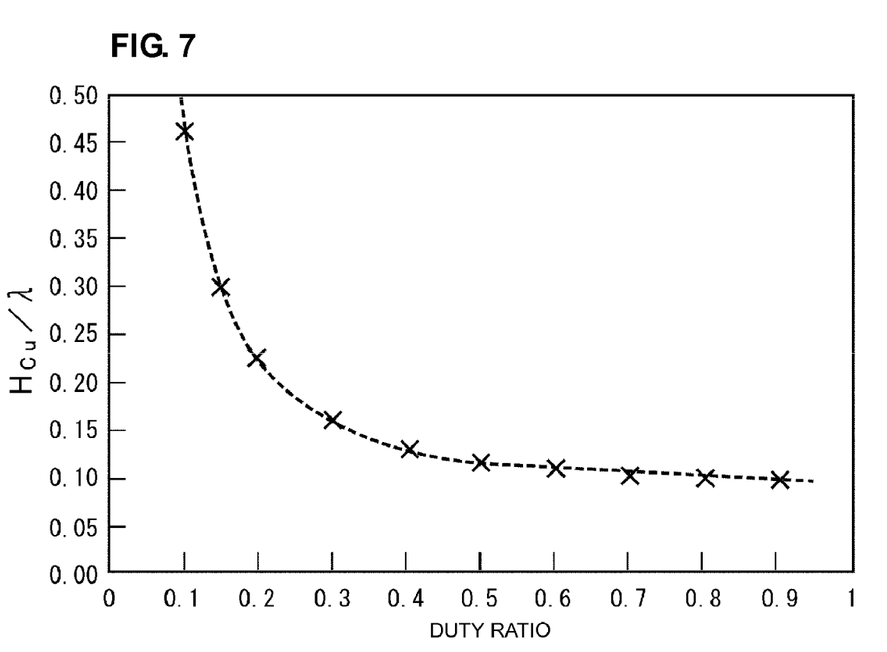
FIG. 7 is a view showing the relationship between a normalized thickness $H_{Cu}/\lambda$ of an IDT made of Cu and the duty ratio when a boundary acoustic wave is confined.

That is, the thickness $H_{Cu}/\lambda$ may be set in the range in which the thickness is equal or substantially equal to or greater than that on the dotted line shown in FIG. 7.

Figure 8:
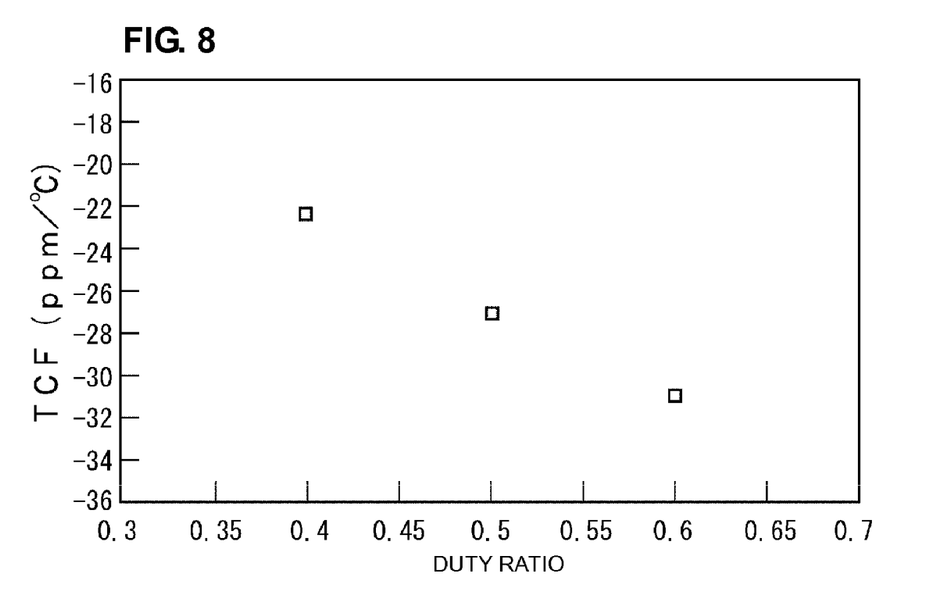
FIG. 8 is a view showing the relationship between the temperature coefficient of frequency TCF and the duty ratio of an IDT which is made of a NiCr/Ti/Pt/Au/Pt/Ti laminate metal film and which has a normalized thickness H/λ of about 6.6%.

FIG. 8 shows the change in temperature coefficient of frequency TCF with the change in duty ratio of the IDT, and the results are shown which are obtained when the IDT has a laminate structure of NiCr/Ti/Pt/Au/Pt/Ti, and when the normalized thickness H/λ is set to about 6.6%. As shown in FIG. 8, when the duty ratio is relatively low, such as less than about 0.5, the absolute value of TCF decreases, and a superior temperature coefficient of frequency can be obtained.

Figure 9:
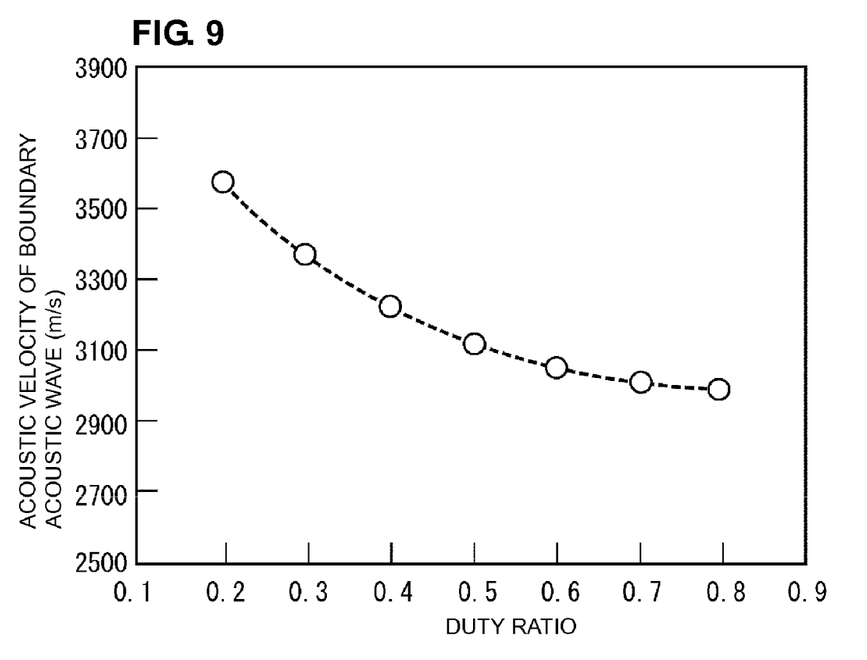
FIG. 9 is a view showing the relationship between the duty ratio and the acoustic velocity of a boundary acoustic wave.

In addition, FIG. 9 is a view showing the relationship between the acoustic velocity of the boundary acoustic wave and the duty ratio obtained when the IDT is made of Au.

FIG. 9 shows that when the duty ratio is greater than about 0.5, that is, when the duty ratio is in a high-ratio range, the duty ratio dependency of the acoustic velocity of the boundary acoustic wave decreases, that is, the dependency of the frequency characteristics on the electrode finger linewidth decreases. Accordingly, since the variation in characteristics caused by fluctuations in the width of each electrode finger is not likely to occur during manufacturing, the yield can be significantly improved. Thus, as shown in FIGS. 8 and 9, according to this preferred embodiment, since the above-described effect can be obtained in both cases in which the duty ratio is decreased to less than about 0.5 and is increased to more than about 0.5, the duty ratio may be selected in accordance with the desired application. That is, TCF and the loss can both be decreased when the duty ratio is decreased to less than about 0.5, and that in addition, a decrease in loss and an improvement in yield can both be achieved when the duty ratio is increased to greater than about 0.5. Thus, according to this preferred embodiment, in accordance with the desired application, when the duty ratio is selected from a range in which the formula (1), (2), or (3) is satisfied, the loss can be decreased.

When the duty ratio and the thickness of the IDT electrode are set in the range defined by the above formula (1) using a material having the density ρ, are set in the range defined by the above formula (2) using Au, or are set in the range defined by the above formula (3) using Cu, the propagation loss of the boundary acoustic wave propagating along the boundary between $SiO_2$ and $LiNbO_3$ becomes approximately 0, and the acoustic velocity of the boundary acoustic wave at a low-frequency end of the passband is decreased to about 3,210 m/sec or less. That is, at a low-frequency side of the passband, the acoustic velocity of the boundary acoustic wave is preferably set to about 85.4% or less of about 3,757 m/sec, which is the transverse acoustic velocity of $SiO_2$. The reason the acoustic velocity of the boundary acoustic wave at a low-frequency side of the passband is set to about 85.4% or less of the transverse acoustic velocity of $SiO_2$ is as follows.

When the duty ratio is relatively low, the thickness of the IDT electrode disposed at the boundary between $SiO_2$ and $LiNbO_3$ is set to be greater than that when the duty ratio is high such that the acoustic velocity of the SH boundary acoustic wave is sufficiently less than about 3,757 m/sec which is the acoustic velocity of a slow transverse wave propagating through $SiO_2$ and about 4,031 m/sec which is the acoustic velocity of a slow transverse wave propagating through $LiNbO_3$.

With a band pass filter, the acoustic velocity (wavelength× frequency) of a boundary acoustic wave in the entire passband must be sufficiently decreased as compared to about 3,757 m/sec which is the acoustic velocity of a slow transverse wave propagating through $SiO_2$.

Even in a band pass filter having a broad band width which is used for a mobile phone, the band width is only about 7% of a central frequency. On the other hand, the wavelength, which is an electrode finger pitch of the IDT electrode, is constant. Accordingly, the acoustic velocity of the boundary acoustic wave at a low-frequency side end of the passband is about 7% or less of the acoustic velocity of the boundary acoustic wave at a high-frequency side end of the passband.

Furthermore, a margin of about 7% is preferably set between the acoustic velocity of the boundary acoustic wave at a high-frequency side of the passband and about 3,757 m/sec which is the acoustic velocity of a slow transverse wave propagating through $SiO_2$. With this margin, the boundary acoustic wave can be sufficiently confined at the boundary between $SiO_2$ and $LiNbO_3$.

Accordingly, the acoustic velocity of the boundary acoustic wave at a high-frequency side of the passband may be set to be not more than about 3,495 m/sec which is about 93% of the acoustic velocity of a slow transverse wave propagating through $SiO_2$. In addition, the acoustic velocity of the boundary acoustic wave at a low-frequency side of the passband may be set to be not more than about 3,210 m/sec which is about 85.4% of the acoustic velocity of a slow transverse wave propagating through $SiO_2$.

Figure 10:
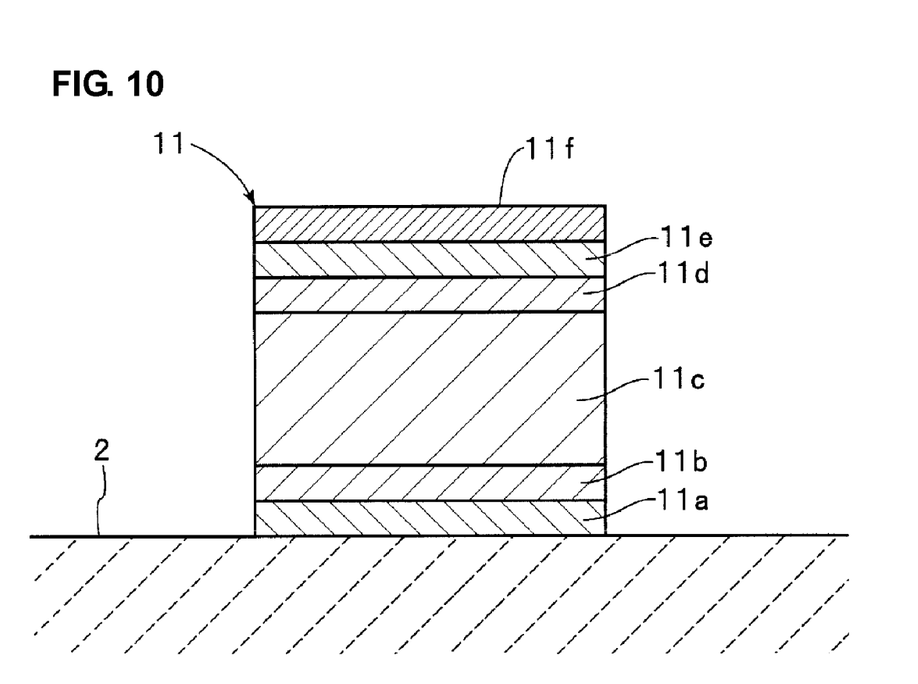
FIG. 10 is a partially enlarged cross-sectional view schematically showing an electrode structure when an IDT used in a boundary acoustic wave filter according to a preferred embodiment of the present invention is made of a laminate metal film.

In the boundary acoustic wave device according to preferred embodiments of the present invention, it is not always necessary that the IDT be made of a single metal layer, and a laminate metal film including a plurality of metal layers that are laminated to each other may also be used. For example, an IDT 11 is shown in FIG. 10, which includes 6 metal layers that are laminated on the piezoelectric substance 2 made of $LiNbO_3$. The 6 metal layers are, from the $LiNbO_3$ side, a Ti layer 11a, a Pt layer 11b, an Au layer 11c, a Pt layer 11d, a Ti layer 11e, and a NiCr layer 11f.

As described above, the IDT 11 may be formed by laminating a plurality of metal layers. In this case, as the density ρ of the IDT 11, the average density may be used which is obtained by dividing the sum of the products of the thicknesses of the metal layers and the densities of metals of the respective metal layers by the sum of the thicknesses of the metal layers.

When the IDT 11 is defined by the laminate metal layer, the adhesion to $LiNbO_3$ and $SiO_2$ can be improved. That is, with Au, the adhesion to $LiNbO_3$ and $SiO_2$ may not be sufficient in some cases. On the other hand, in the laminate metal film, since the Ti layer 11a is provided, the adhesion to $LiNbO_3$ can be improved. In addition, when the Ti layer 11e is provided, the adhesion to the NiCr layer 11f provided thereon can be improved. When the Ti layer 11e is directly adhered to $SiO_2$, that is, when the NiCr layer 11f is not provided, the adhesion to $SiO_2$ can also be improved.

In addition, the NiCr layer 11f disposed at the topmost location is provided to perform frequency adjustment. After an NiCr film is formed, the frequency adjustment can be performed by decreasing the thickness thereof, or the frequency can be adjusted by forming the NiCr layer to have a large thickness. That is, the variation in frequency caused by the linewidth and the thickness of the electrode can be suppressed by adjusting the thickness of the NiCr layer 11f.

In addition, the Pt layers 11b and 11d are provided to prevent the diffusion of Au. That is, when the Au layer 11c is in direct contact with the Ti layers 11a and 11e, mutual diffusion may occur between Au and Ti by heating. Accordingly, in order to prevent the diffusion, the Pt layers 11b and 11d are provided between the Au layer 11c and the Ti layers 11a and 11e.

Since the density of Pt is relatively high, when the Pt layers are laminated without changing the thickness of the Au layer, the influence on the thickness of the IDT 11 is increased, and the characteristics are changed. Accordingly, the thickness of the Au layer is preferably decreased so as to suppress the influence.

However, since the resistivity of Pt is greater than that of Au, when the thicknesses of the Pt layers are increased, and when the thickness of the Au layer 11c is decreased, the resistance of each electrode finger increases. As a result, the loss increases. Thus, the thickness of each of the Pt layers 11b and 11d is preferably set so as to prevent the diffusion between Au and Ti and so as not to increase the loss. According to experiments performed by the inventors of the present invention, it was confirmed that when the thickness of the Pt layer is set to at least about 3 nm, the diffusion between Au and Ti can be prevented, and when the thickness of the Pt layer is set to about 10 nm or less, a significant increase in insertion loss does not occur. Thus, the thickness of each of the Pt layers 11b and 11d is preferably set in the range of about 3 nm to about 10 nm, for example.

In addition, the duty ratio of the IDT is preferably set in the range of about 0.30 to about 0.70 and is more preferably set in the range of about 0.30 to about 0.40. When the linewidth of each electrode finger of the IDT is similar to the width of the gap between the electrode fingers, manufacturing can be easily performed. That is, when the duty ratio is in the vicinity of about 0.50, manufacturing can be easily performed. Accordingly, when the duty ratio is set in a range that is in the vicinity of about 0.5, that is, in the range of about 0.30 to about 0.70, the loss can be decreased in accordance with preferred embodiments of the present invention without complicated steps of manufacturing the IDT.

Since manufacturing can be easily performed, and TCF and the loss can be decreased, the duty ratio is more preferably set in the range of about 0.30 to about 0.40, for example.

According to preferred embodiments of the present invention, the IDT may be made of various metal materials. However, the IDT is preferably made of Au or an alloy primarily including Au, that is, the IDT preferably includes an Au-based metal layer. In this case, the IDT may be made of a single metal film that is made only of an Au-based metal, or as shown in FIG. 10, the IDT may be made of a laminate metal film including an Au-based metal layer.

In addition, the boundary acoustic wave filter according to preferred embodiments of the present invention is not only applied to a filter having the electrode structure shown in FIG. 1B but is also applied to boundary acoustic wave filters having various electrode structures.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a piezoelectric substance made of LiNbO$_3$ having a surface obtained by rotating a Y axis by about 15°±10° as a primary surface;
   a dielectric substance made of a silicon oxide laminated to the piezoelectric substance; and
   an electrode structure disposed at a boundary between the piezoelectric substance and the dielectric substance and including an IDT arranged to utilize a boundary acoustic wave propagating along the boundary; wherein
   when a density of the IDT, a thickness thereof, a wavelength determined by a period of electrode fingers of the IDT, and a duty ratio thereof are represented by ρ (kg/m$^3$), H (µm), λ (µm), and x, respectively, x and a product of H/λ and ρ are set in a range that satisfies the following formula (1):

$$(H/\lambda) \times \rho > 70.7924(x+0.055)^{(-2.0884)} + 797.09 \quad \text{Formula (1); and}$$

the IDT includes an Au-based metal layer made of Au or an alloy primarily including Au and is made of a laminate metal film including a frequency adjusting film/Ti/Pt/the Au-based metal layer/Pt/Ti.

2. The boundary acoustic wave device according to claim 1, wherein the silicon oxide is SiO$_2$, and an acoustic velocity of the boundary acoustic wave is not greater than about 93% of a transverse wave velocity of about 3,757 m/sec of SiO$_2$.

3. The boundary acoustic wave device according to claim 1, wherein the IDT includes Au or an alloy primarily including Au, and when the thickness of Au or an alloy primarily including Au is represented by H$_{Au}$, the thickness H$_{Au}$ is set in the range that satisfies the following formula (2):

$$H_{Au}/\lambda > 0.003668(x+0.055)^{(-2.0884)} + 0.0413 \quad \text{Formula (2).}$$

4. The boundary acoustic wave device according to claim 1, wherein the IDT includes a laminate metal film including a plurality of metal layers laminated to each other, and when the average density obtained in accordance with a thickness ratio of each of the plurality of metal layers laminated to each other is represented by the above ρ (kg/m$^3$), and when the total thickness of the laminate metal film is represented by the above H, the product of H and ρ satisfies the formula (1).

5. The boundary acoustic wave device according to claim 1, wherein thicknesses of the Pt layers are each in the range of about 3 nm to about 10 nm.

6. The boundary acoustic wave device according to claim 1, wherein a duty ratio of the IDT is in a range of about 0.3 to about 0.7.

7. A boundary acoustic wave device comprising:
   a piezoelectric substance made of LiNbO$_3$ having a surface obtained by rotating a Y axis by about 15°±10° as a primary surface;
   a dielectric substance made of a silicon oxide laminated to the piezoelectric substance; and
   an electrode structure disposed at a boundary between the piezoelectric substance and the dielectric substance and including an IDT arranged to utilize a boundary acoustic wave propagating along the boundary; wherein
   when a density of the IDT, a thickness thereof, a wavelength determined by a period of electrode fingers of the IDT, and a duty ratio thereof are represented by ρ (kg/m$^3$), H (µm), λ (µm), and x, respectively, x and a product of H/λ and ρ are set in a range that satisfies the following formula (1):

$$(H/\lambda) \times \rho > 70.7924(x+0.055)^{(-2.0884)} + 797.09 \quad \text{Formula (1); and}$$

a duty ratio of the IDT is in a range of about 0.3 to about 0.4.

8. The boundary acoustic wave device according to claim 7, wherein the silicon oxide is $SiO_2$, and an acoustic velocity of the boundary acoustic wave is not greater than about 93% of a transverse wave velocity of about 3,757 m/sec of $SiO_2$.

9. The boundary acoustic wave device according to claim 7, wherein the IDT includes Au or an alloy primarily including Au, and when the thickness of Au or an alloy primarily including Au is represented by $H_{Au}$, the thickness $H_{Au}$ is set in the range that satisfies the following formula (2):

$$H_{Au}/\lambda > 0.003668(x+0.055)^{(-2.0884)} + 0.0413 \qquad \text{Formula (2).}$$

10. The boundary acoustic wave device according to claim 7, wherein the IDT includes Cu or an alloy primarily including Cu, and when the thickness of Cu or an alloy primarily including Cu is represented by $H_{Cu}$, the thickness $H_{Cu}$ is set in the range that satisfies the following formula (3):

$$H_{Cu}/\lambda > 0.007927(x+0.055)^{(-2.0884)} + 0.08926 \qquad \text{Formula (3).}$$

11. The boundary acoustic wave device according to claim 7, wherein the IDT includes a laminate metal film including a plurality of metal layers laminated to each other, and when the average density obtained in accordance with a thickness ratio of each of the plurality of metal layers laminated to each other is represented by the above $\rho$ (kg/m$^3$), and when the total thickness of the laminate metal film is represented by the above H, the product of H and $\rho$ satisfies the formula (1).

* * * * *